(12) United States Patent
Frosien

(10) Patent No.: US 7,968,855 B2
(45) Date of Patent: Jun. 28, 2011

(54) DUAL MODE GAS FIELD ION SOURCE

(75) Inventor: Juergen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 256 days.

(21) Appl. No.: 12/366,390

(22) Filed: Feb. 5, 2009

(65) Prior Publication Data

US 2009/0200484 A1 Aug. 13, 2009

Related U.S. Application Data

(60) Provisional application No. 61/027,344, filed on Feb. 8, 2008.

(30) Foreign Application Priority Data

Feb. 8, 2008 (EP) ..................................... 08101447

(51) Int. Cl.
*H01J 27/02* (2006.01)
(52) U.S. Cl. ................................. 250/423 F; 250/396 R
(58) Field of Classification Search .............. 250/396 R, 250/423 R–423 F; 315/111.81–111.91
See application file for complete search history.

(56) References Cited

U.S. PATENT DOCUMENTS 7,554,097 B2 * 6/2009 Ward et al. ................. 250/423 F
7,589,328 B2 * 9/2009 Frosien et al. ............. 250/423 F

OTHER PUBLICATIONS

Edinger, et. al. "Development of a High Brightness Gas Field Ion Source", Journal of Vacuum Science and Technology B: Microelectronics Processing and Phenomena, vol. 15(6) Nov. 1, 1997, pp. 120-124, American Vacuum Society, New York NY.*
Ochiai, et. al. "Flourine Field Ion Source Using Flourine-Helium Gas Mixture", Journal of Vacuum Science & Technology A 9 Jan./Feb. 1991 No. 1, p. 51-56.*
Extended European Search Report for European Application No. 08101447.4-2208 dated Jul. 16, 2008.
K. Edinger, et al.; "Development of a high brightness gas field ion source"; Journal of Vacuum Science and Technology B:Microelectronics processing and phenomena; vol. 15(6); Nov. 1, 1997; pp. 120-124 American Vacuum Society; New York, NY.
CH. Wilbertz, et al.; "A focused gas-ion beam system for submicron application"; Nuclear Instruments and Methods in Physics Research, Section-B: Beam Interactions with Materials and Atoms, Elsevier; Jan. 1, 1992; pp. 120-124 vol. B63, No. 1/02; Amsterdam, NL.

(Continued)

*Primary Examiner* — Jack I Berman
*Assistant Examiner* — David Smith
(74) *Attorney, Agent, or Firm* — Patterson & Sheridan, L.L.P.

(57) ABSTRACT

A focused ion beam device is described. The focused ion beam device includes an ion beam column including an enclosure for housing a gas field ion source emitter with an emitter area for generating ions, an electrode for extracting ions from the gas field ion source emitter, one or more gas inlets adapted to introduce a first gas and a second gas to the emitter area, an objective lens for focusing the ion beam generated from the first gas or the second gas, a voltage supply for providing a voltage between the electrode and the gas field ion source emitter, and a controller for switching between a first voltage and a second voltage of the voltage supply for generating an ion beam of ions of the first gas or an ion beam of ions of the second gas.

25 Claims, 6 Drawing Sheets

OTHER PUBLICATIONS

R. Borret, et al.; "Current-voltage characteristics of a gas field ion source with a supertip"; Journal of Physics D: Applied Physics;Oct. 14, 1990; pp. 1271-1277; vol. 23 No. 10; IOP Publishing Ltd.; Bristol, GB.

CH. Wilbertz, et al.; "Recent progress in Gas Field Ion Source technology"; Proceedings of the Spie; Jan. 1, 1994; pp. 407-417; vol. 2194; Bellingham, VA.

A. Knoblauch, et al.; "Electron and ion emission properties of iridium supertip field emitters"; Nuclear Instruments and Methods in Physics Research B: Beam Interactions with Materials and Atoms, Elsevier; Apr. 1, 1998; pp. 20-27; vol. 139 Nos. 1-4;Amsterdam, NL.

Y. Ochiai, et al.; "Flourine field ion source using flourine-helium gas mixture"; Journal of Vacuum Science and Technology: Part A, AVS/AIP; Jan. 1, 1991; pp. 51-56; vol. 9, No. 1; Melville, NY.

* cited by examiner

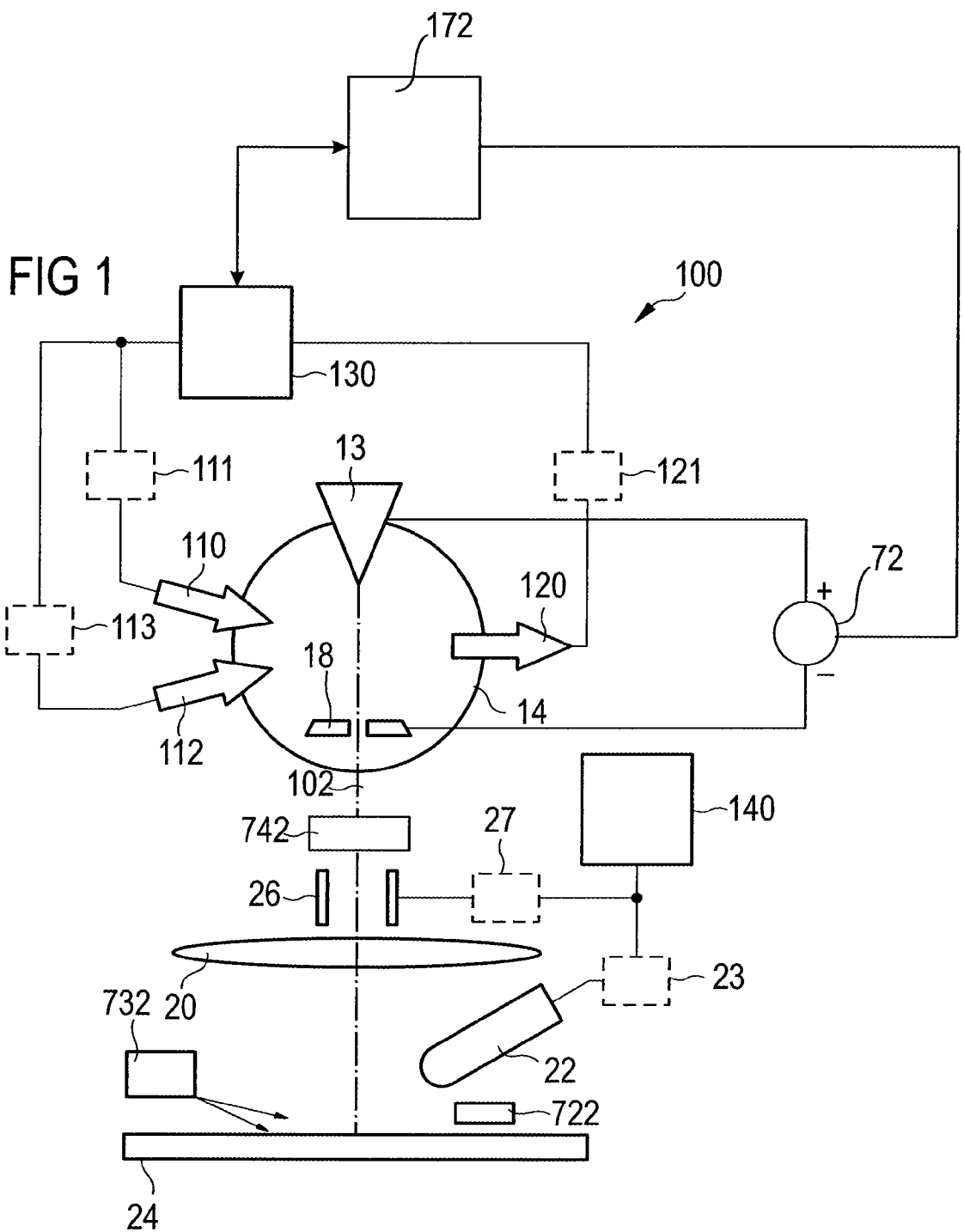

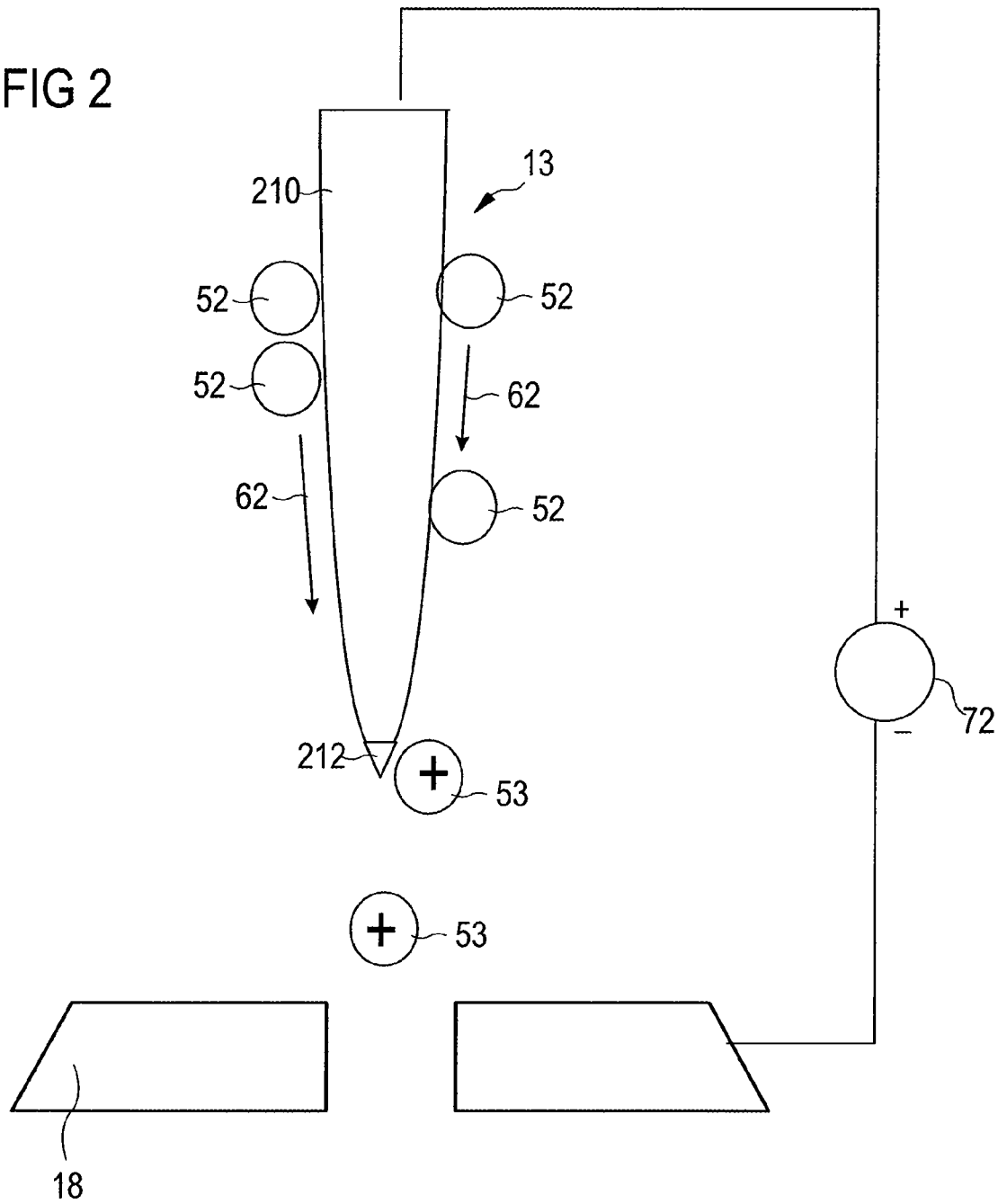

DUAL MODE GAS FIELD ION SOURCE

FIELD OF THE INVENTION

The invention relates to a charged particle beam device and a method of operating a charged particle beam device. Particularly, it relates to a focused ion beam device having a gas field ion source, in particular for imaging, inspecting and structuring a specimen. Further, it relates to a gas field ion source column for dual mode operation and a method of operating a gas field ion source with different modes of operation. More specifically, it relates to a focused ion beam device and a method of operating a focused ion beam device.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

During manufacturing of semiconductor devices or the like, a plurality of observation steps and sample modification steps are usually conducted. Common systems include an electron beam column for observation, imaging, testing or inspecting of a specimen and an ion beam column for patterning of a specimen or material modification. These "dual beam" systems have a high complexity and are, thus, expensive.

SUMMARY

In light of the above, the present invention provides a focused ion beam device according to independent claim 1 and 16 and a method of operating a focused ion beam device according to independent claim 19.

According to one embodiment, a focused ion beam device is provided. The focused ion beam device includes an ion beam column including an enclosure for housing a gas field ion source emitter with an emitter area for generating ions, an electrode for extracting ions from the gas field ion source emitter, one or more gas inlets adapted to introduce a first gas and a second gas to the emitter area, an objective lens for focusing the ion beam generated from the first gas or the second gas, a voltage supply for providing a voltage between the electrode and the gas field ion source emitter, and a controller for switching between a first voltage and a second voltage of the voltage supply for generating an ion beam of ions of the first gas or an ion beam of ions of the second gas.

Further advantages, features, aspects and details that can be combined with embodiments described herein are evident from the depending claims, the description and the drawings.

According to another embodiment, a focused ion beam device is provided. The focused ion beam device includes an ion beam column including an enclosure for housing an emitter with an emitter area for generating ions of a light gas and a heavy gas, means for switching between a first extraction voltage and a second extraction voltage, wherein the light gas is selected from the group consisting of hydrogen and helium and the heavy gas has an atomic mass of 10 g/mol or higher.

According to another embodiment, a method of operating a focused ion beam device is provided. The method includes biasing an emitter within an emitter area wherein ions are generated to a first potential for providing a first extraction voltage for emitting an ion beam of a light gas, biasing an emitter within an emitter area wherein ions are generated to a second potential for providing a second extraction voltage for emitting an ion beam of a heavy gas, wherein the light gas is selected from the group consisting of hydrogen and helium and the heavy gas has an atomic mass of 10 g/mol or higher.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 1 shows a schematic view of parts of a charged particle beam device in the form of a focused ion beam device with a first gas inlet and a second gas inlet according to embodiments described herein;

FIG. 2 shows a schematic view of a an emitter tip in a gas field ion source and the principle of operation of the emitter tip according to embodiments described herein;

DETAILED DESCRIPTION OF THE INVENTION

Figure 3A:
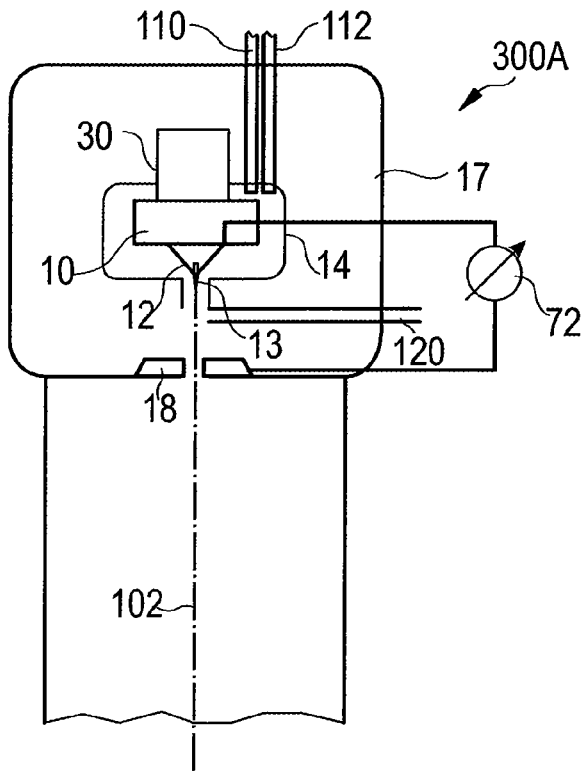
FIG. 3A shows a schematic view of parts of a charged particle beam device in the form of a focused ion beam device with a first gas inlet and a second gas inlet according to embodiments described herein.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited or which are structured. A specimen includes a surface to be structured or on which layers are deposited, an edge, and typically a bevel.

According to embodiments described herein, a single column charged particle beam device is provided, which allows for a high resolution imaging and sample modification. Thereby, a simplified single column operation can be provided. Further, in light of the fact that one column can be omitted, a reduction of costs can be achieved.

Generally, focused ion beam devices can, for example, be based on liquid-metal ion sources or gas ion sources. Ions in gas ion sources can be produced by bombardment of electrons, atoms or ions with gas atoms or molecules or by exposing gas atoms or molecules to high electric fields or irradiation. Thereby, noble gas ion sources have been found to be potential candidates for focused ion beam FIB applications. Sources based on the field ionization process are known as gas field ion sources (GFIS). An ionization process takes place at high electric fields larger $10^{10}$ V/m. The field may, for example, be applied between an emitter tip and a biased extraction aperture.

The emitter tip is biased to a positive potential with respect to a downstream extraction aperture, whereby an electric field strong enough to ionize the gas atoms in the vicinity of the tip of the emitter unit is generated. The area in the vicinity of the emitter, wherein the desired electric field is provided or more generally, wherein the generation of ions is conducted, may be referred to as an emitter area. Gas pressures of $10^{-6}$ mbar to $10^{-2}$ mbar are desirable near the tip of the emitter unit. Thereby, as explained in more detail below, a gas gradient is typically used in order to, on the one hand, provide a sufficient amount of gas atoms or molecules in the emitter area and, on the other hand, do not disturb emitted ions by gas molecules provided in the gun chamber.

FIG. 1 shows a first gas inlet 110 and a second gas inlet 112. According to embodiments described herein different modes of operation can be provided. According to one operational mode, a light gas, such as hydrogen or helium is introduced into the chamber/enclosure 14 through one the first and the second gas inlet and an ion beam of the ionized light gas can be generated. The light gas ions can be used for an observation or imaging without damaging the specimen.

According to another operational mode, a different gas, which is a heavier gas as, for example, argon, neon, xenon or krypton is introduced into the chamber/enclosure 14 through the wafer one of the first or second gas inlets 110 or 112. The ion beam of the ionized heavy gas, which is generated within the gun chamber, that is the enclosure 14, is similar to an ion beam of a standard focused ion beam column for sputtering material. The heavy gas beam can, thus, be used for material modification or to produce cuts or trenches within a specimen or to get depth information.

Within the embodiments described herein, the enclosure 14, in which the emitter 12 including the emitter tip 14 is provided, may be a part of the ion beam column. Alternatively, it may be a separate chamber included in the ion beam column. Further, it is possible that the ion beam column itself provides the enclosure, wherein the emitter is located and wherein the gases are introduced.

The light gas ions do not sputter the sample material, and can be used for imaging, testing, observation or the like. Thereby, a light gas ion may have an even better resolution than an electron beam because of the shorter wavelengths of the ion beam as compared to an electron beam Generally, as shown in FIG. 1, a focused ion beam device 100 can schematically be illustrated as follows. An enclosure 14 with a biased gas field ion source emitter tip 13 is provided. Further, a first (light) gas inlet 110 and a second (heavy) gas inlet 112 is provided. Thereby, the first gas and the second gas are provided into the enclosure 14 towards the emitter tip 13 and to the emitter area in the vicinity of the emitter. In the vicinity of the emitter tip the desired excitation conditions are provided. According to different embodiments, which can be combined with other embodiments described herein, the two gas inlets can be provided in the form of two nozzles, gas channels, or other gas inlet means. According to other embodiments, the two gas inlets provide the two gases in a common nozzle, gas channel, or other gas inlet means.

As shown in FIG. 1, a gas outlet 120 is provided. The gas outlet 120 can be connected to a vacuum pump, a further vacuum chamber, or other means to support the evacuation and/or the control of the pressure in the enclosure 14. Thereby, the process parameters for ion beam generation can be controlled.

Typically, a gas pressure gradient with the gun chamber can be provided. Thereby, the gas pressure is higher in the vicinity of the emitter and the emitter tip and is reduced towards an extraction electrode. Thereby, a sufficient amount of gas can be provided to the emitter tip and the amount of gas that may disturb the ion emission is reduced. According to different examples, which can be combined with any of the embodiments described herein, the gas pressure gradient may reach from 1e-5 mbar to 5e-3 mbar, typically from 1e-4 mbar to 1e-3 mbar. Behind the extractor the gas pressure decreases further.

As shown in FIG. 1, according to some embodiments described herein, a controller 130 can be provided. The controller 130 controls the supply of light gas into the enclosure 14 and the supply of heavy gas in the enclosure 14. Further, for embodiments including a separate gas outlet 120, the controller may control the gas outlet, a vacuum system, vacuum pumps or valves corresponding therewith. According to further embodiments, controllers 111, 113 and 121 can be provided. These controllers are controllers for the individual inlets, outlets, valves, pumps and the like. As indicated by the dashed lines, these controllers may be omitted as they are redundant in the case the controller 130 is able to control the components directly.

The ion beam is focused by the lens 20 on the specimen 24. According to one embodiment, lens 20 is an electrostatic lens. Depending on the application, one or more optical elements like lenses, deflectors, Wien filters, condensers, alignment units, collimators, acceleration or deceleration units, apertures etc. could be additionally arranged in the focused ion beam device.

Generally, the ion beam is deflected with a scan deflector 26 to raster scan the ion beam over the specimen 24 or position the ion beam at the position of the specimen. Secondary and/or backscatter particles, for example secondary and/or secondary electrons are detected with detector 22, in particularly when the focused ion beam device is operated in an observation mode.

According to further embodiments, as shown in FIG. 1, a controller 140 can be provided. Controller 140 controls the scan deflector 26 and the detector 22. During the observation mode of the focused ion beam device 100, the device works similar to a scanning electron microscope. The ion beam with a diameter of a few nanometers or less (e.g., 1 nm or less) is scanned over the specimen 24, e.g. raster scanned in a pattern over the specimen 24, vector-scanned, or interlaced scanned. Secondary and/or backscattered electrons or other corpuscles can be detected with a detector. A time resolved signal is generated and the controller 140 allows for correlating a signal at a given instance of time with a corresponding deflection value. Thereby, the raster pattern can be assembled to an image by correlating the signals with respect to the position on the specimen 24.

A dual mode gas ion column could, on the one hand, be provided by supplying different gases, that is, for example a light gas and a heavy gas, in the enclosure 14 and switching between the two modes of operation by supplying different gases for each of the operational mode. According to embodiments described herein, which can individually be combined with details of the individual examples, instead of supplying the different species of gas by switching between the different gas supplies, the gas field ion gun may contain a mixture of the required gases. Thereby, the selection of different ion species can be conducted based on different ionization energies.

In light of the above, according to some embodiments described herein, an adjustable power supply 72 is provided for supplying an extraction voltage between the emitter tip 13 and the electrode 18. The extraction voltage can be controlled by a controller 172 as will be described in more detail below. Further, the controller may optionally also control the controller 130 for controlling the partial pressures of the gases.

FIG. 2 shows an emitter tip 13 and an extraction electrode 18. Between the emitter tip and the extraction electrode a voltage supply 72 is provided for generating a high electric field. The emitter tip 13 includes the shank 210 and the super tip 212. According to different embodiments, the super tip 212, which is provided at the tip of the shank 210 can be a tip including one, two, three, four, five atoms or more. The operation principle of the ion generation of a gas field ion source is explained with respect to one species. As shown in FIG. 2, for example helium atoms 52 which are ionized to generate helium ions 53 are provided.

The emitter tip 13 can typically in communication with a cooling unit (not shown). According to different embodiments, which can be combined with any of the embodiments described herein, the cooling unit can include any of the following systems: the cooling unit maybe a cryo-cooler, EG, open or closed cycle-coolers, open or closed cycle helium coolers, open or closed cycle nitro tin coolers, a combination thereof or another cooler. Particular examples can be a pulse tube cooler or GM cooler (Gifford McMahon cooler).

If helium gas is provided to the emitter tip along direction in FIG. 2 from top to bottom, the helium atoms 52 condense at the shank 210 of the emitter 13. Thereby, it is typically desired to have a shank 210 which provides a sufficiently large surface for condensation of the helium atoms. The surface can be in a range typically from 0.2 $\mu m^2$ to 5 $\mu m^2$.

As indicated by arrows 62 the atoms diffuse towards the super tip 212. Thereby, movement based on diffusion due to different helium concentration at the shank 212 with respect to the super tip 212 and based on drifts due to the electric field can result in a movement of the helium atoms 52 towards the super tip 53. As an example, helium as an ionization energy of approximately 44 V/nm. The voltage between the emitter tip 13 and the extraction electrode 18 is chosen such that the electric field at the super tip 212 provides the at least the ionization energy for the species to be ionized. Thereby, it has to be considered that the electric field at the super tip with it's small various is higher than at any other point of the emitter. Helium atoms 52 are thus ionized at the super tip 212 and are emitted as helium ions 53.

Figure 3B:
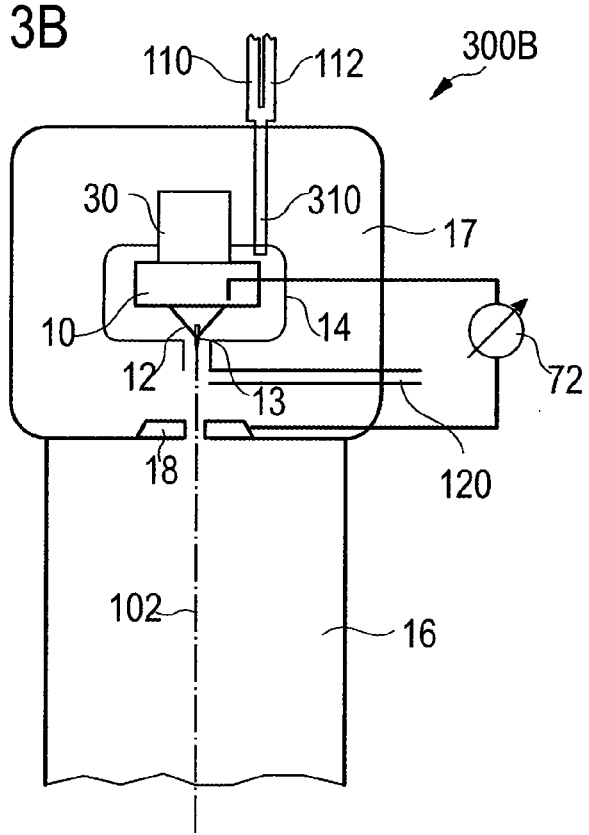
FIG. 3B shows a schematic view of parts of a charged particle beam device in the form of a focused ion beam device with a first gas inlet, a second gas inlet, and a common gas inlet according to embodiments described herein.

FIGS. 3a and 3b illustrate further embodiments of a portion of focused ion beam columns 300a and 300b, respectively. Therein, a gun chamber 17 is provided on top of the column 16. The emitter 12 including the emitter tip 13 is provided within an enclosure 14. The emitter 12 is mounted to an emitter holder 10. A cooling unit 30 is provided to have thermal conductivity between the cooling unit 30 to the emitter tip 13 via the emitter holder 10. An extraction electrode 18 is provided for the voltage between the emitter tip 13 and the extraction electrode. Connections from the emitter to the extraction electrode are connected via a voltage supply 72, which is able to provide different voltages. Further, as shown in FIG. 3a a first gas inlet 110 and a second gas inlet 112 provide a first and a second gas, respectively, to the enclosure such that a gas mixture is provided to the emitter. According to some embodiments described herein, the enclosure 14 is shaped such that the gas is provided to the emitter 13 from top to bottom in order to provide a sufficiently large condensation surface at the shank of the emitter tip. A gas outlet 120 can be included in order to evacuate and/or control the pressure in the enclosure 14. The ions generated in the vicinity of the emitter tip 13 are accelerated towards the extraction electrode and are guided along optical access 102.

As shown in FIG. 3b, according to some embodiments it is possible that the first gas inlet and the second gas inlet provide the gas to a common gas inlet 310, which supplies the gas mixture into the enclosure 14. According to embodiments described herein, the gas mixture can be either provided to the vicinity of the emitter tip by having two separate gas inlets, having two separate gas inlets feeding the respective gases into a common gas inlet, or by supplying a gas mixture to the enclosure through a single gas inlet.

According to yet further embodiments, more than two gases and, thus, more than two gas inlets can be provided for feeding gases into the enclosure or a common gas inlet. Further, it is possible, that a mixture of more than two gases, for example three or four gases can be directly feed into the enclosure.

Figure 4:
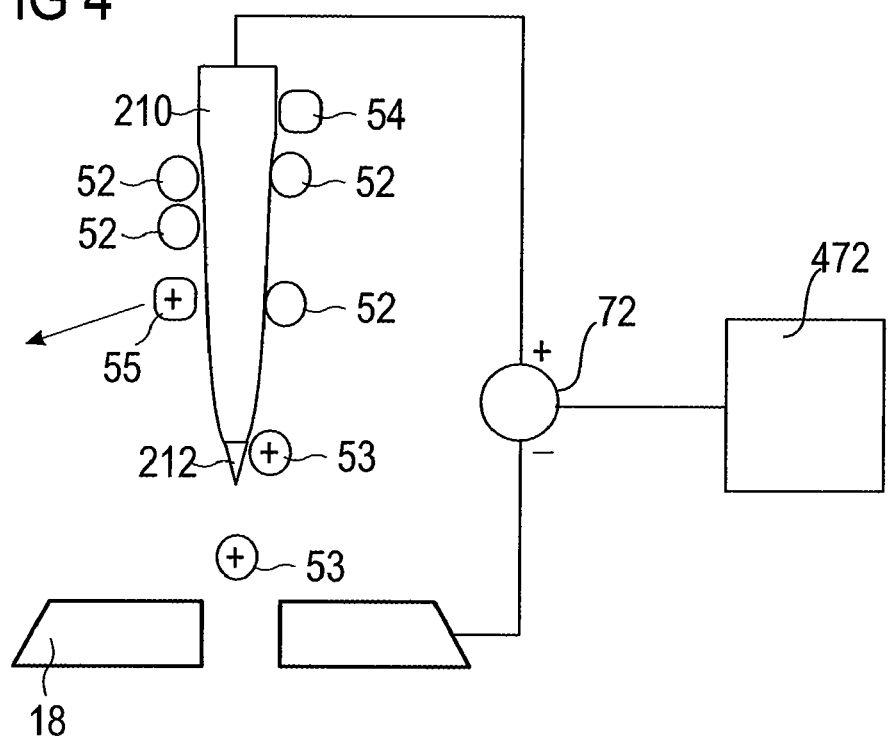
FIG. 4 shows a schematic view of a an emitter tip in a gas field ion source and the principle of operation of the emitter tip in a first mode of operation according to embodiments described herein.
Figure 5:
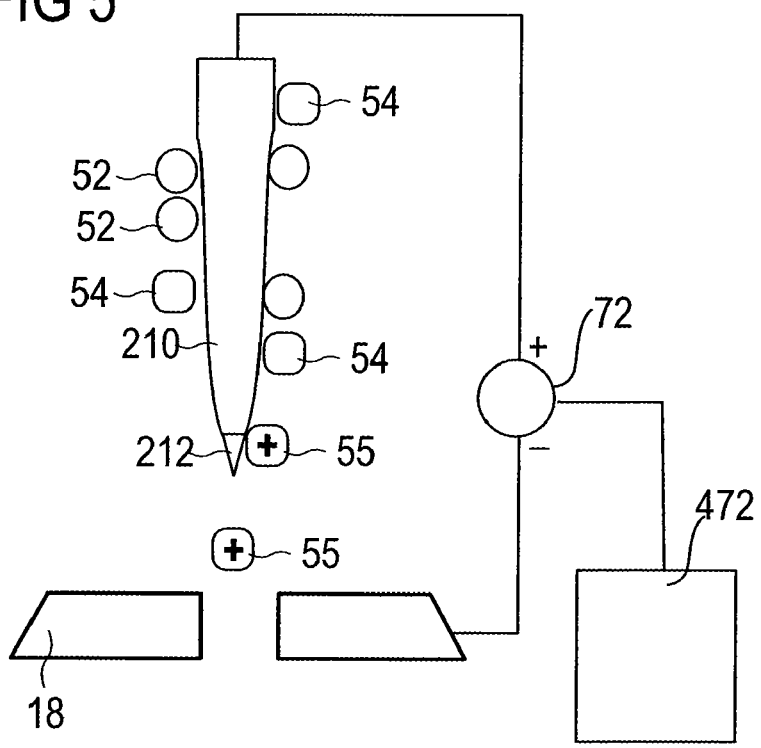
FIG. 5 shows a schematic view of a an emitter tip in a gas field ion source and the principle of operation of the emitter tip in a second mode of operation according to embodiments described herein.

The dual or multiple modes of operation, which are provided according to embodiments described herein, can be better understood with respect to FIGS. 4 and 5. As an example reference is made to helium as a light (first) gas and argon as a second (heavy) gas. It is to be understood that according to other embodiments any combination of gases described herein can be used.

Within FIG. 4 a voltage is provided by the voltage source 72 between the emitters 13 and the extraction electrode 18. The voltage source can be controlled by controller 472 According to some embodiments, the controller 472 can be in communication with a controller for the supply of the first and the second gas inlet. The emitter includes a shank 210 and a super tip 212. For the example illustrated in FIG. 4, a mixture of helium atoms 52 and argon atoms 54, which are indicated by different shapes are provided to be able to condensate at the shank 210 of the emitter tip 13. Helium has an ionization energy corresponding to an electric field of approximately 44 V/nm while argon has an ionization energy corresponding to 22 V/nm. If, for example, a helium ion beam of helium ions 53 is to be formed, the voltage supply 72 is adjusted such that an electric field of approximately 44 V/nm or slightly higher is provided at the position of the super tip 212. As shown in FIG. 4 helium atoms 52 condensate at the shank 210 and move by diffusion or drift towards the super tip 212 where the helium atoms are ionized. For the voltage provided between the emitter tip and the extractor electrode as indicated in FIG. 4 the helium atoms 52 are ionized at the vicinity of the super tip in light of the higher electric field due to the small radius of the tip. Since the ionization energy of argon being significantly lower (22 V/nm) as compared to the ionization energy of helium (44 V/nm) the argon atoms 54 are ionized to argon ions 55 before they reach the super tip 112. Accordingly, argon ions are generated at the shank 210 and do not reach the emitter tip because they are ionized earlier while they diffuse along the emitter shank. In light of the positive potential of the shank 210 the argon ions are repelled by the shank and do not form a collimated beam at the super tip. Since the argon ions are emitted from a much larger region as compared to the helium ions argon does not form a collimated beam under the voltage supply conditions indicated in FIG. 4.

According to some embodiments, which can be combined with other embodiments described herein it would be possible to provide a mass separator 742 (See, e.g., FIG. 1) such as a magnetic deflector, a Wien-filter or the like in the event a significant number of argon ions would travel along the optical access and would reach the sample.

For a second mode of operation, which is illustrated in FIG. 5 the voltage supply 72 is adjusted to provide a voltage such that the extraction field is approximately 22 V/nm or slightly above this value. Thereby, the maximum electric field is significantly below the value required for ionization of helium. Accordingly only argon is ionized and argon ions 55 are generated in the vicinity of the super tip 212. As described above, the argon atoms condense at the shank 210 of the emitter 13 and diffuse and/or drift towards the super tip by a concentration gradient and/or an electric field along the shank 210. Since the field strengths illustrated in FIG. 5 is to low for helium ionization an argon beam is formed and guided through extraction electrode 18 along the optical access towards the specimen.

As shown in FIG. 5, helium atoms 52 condensate at the shank 210 of the emitter 13. Since helium is not emitted from the emitter tip it might accumulate on the tip. Depending on the operation conditions the accumulated helium may reduce the argon supply along the shank 210. If the argon supply along the shank towards the super tip 212 is reduced to an unacceptable amount a short pulse with a high field strengths can be applied to emit the helium atoms and reduce the amount of helium atoms that are condensed on the emitter tip 13. According to additional or alternative embodiments, the emitter tip can be heated by, for example, a short current pulse through the supporting wire to evaporate the absorbed gases. Thereby a similar or additional effect can be generated.

According to some embodiments, which can yield by a combination with other embodiments described herein, the ratio between the "light" gas and the heavy gas can be adjusted according to requirements. Since heavy species are used for etching etc. which should be done fast, concentration of heavy species can be larger than concentration of He.

By switching the potential difference between the emitter tip 13 and the extraction electrode 18, or by other adjustments to change the electrical field at the super tip 212 different modes of operation with emitting different ion beams can be generated.

According to embodiments described herein, a gas mixture can be provided in a range of $10^{-4}$ mbar to $10^{-2}$ mbar.

According to embodiments described herein, which can be combined with other embodiments described herein, at least two different voltages are provided by the power supply 72. According to a first operational mode a voltage is provided that corresponds to a high electric field at the position of the tip of the emitter tip 13 where the highest electric field is provided. Thereby the emitter tip provides 3 different regions with respect to a first, lower electric field and a second, higher electric field. At the very top of the shank 210 the electric field is below the first and the second electric field. At an intermediate portion of the shank 210 an electric field is equal to the first, lower electric field such, that the first species can be ionized. Further, in the vicinity of the tip with the smallest curvature an electric field equal to or at least having the second, higher electric field. Thereby according to this mode of operation two species get ionized. However only one of them forms accumulated beam at the tip of the emitter tip 13.

For the second mode of operation the electric field is below the first, lower electric field along the majority of the emitter tip 13. The first, lower electric field is reached only at the portion of the emitter tip with the smallest curvature or in the vicinity of this position. Accordingly only one species is ionized.

Figure 6:
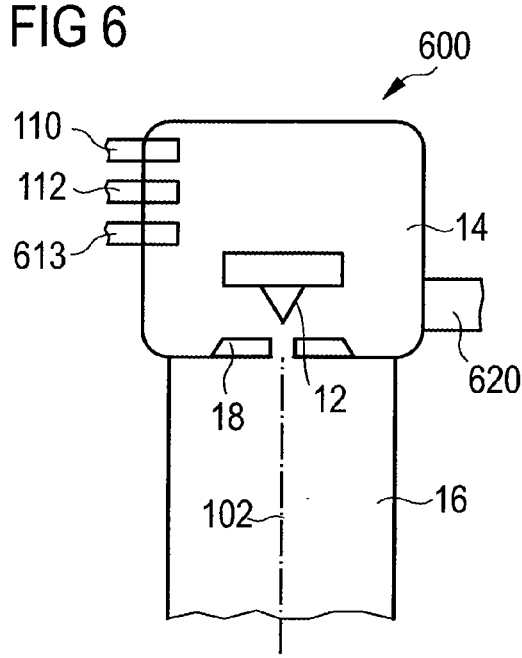
FIG. 6 shows a schematic view of parts of a charged particle beam device in the form of a focused ion beam device with a first gas inlet, a second gas inlet and a third gas inlet according to embodiments described herein.

FIG. 6 illustrates embodiments of further focused ion beam devices 600. The charged particle beam device includes an emitter 12, an enclosure/gun chamber 14, and an ion beam column 16. An electric field is provided between the emitter tip of the emitter 12 and the extraction electrode 18. Ions of gases, which are present in the enclosure 14, are generated by the high electric field in the vicinity of the small curvature of the tip portion of the emitter tip, e.g. a super tip.

According to one embodiment, a first gas inlet 110, a second gas inlet 112 and a third gas inlet 613 are provided. Thereby, three different gases and/or a mixture thereof can be provided in the enclosure. For example, a light gas like hydrogen or helium maybe introduced through the first gas inlet 110 for observation of a specimen without damaging the specimen. For a different mode of operation, a second gas like argon, neon, xenon or krypton maybe introduced through the second gas inlet 112 for sputtering of a specimen. For an even further mode of operation, a third gas having different properties with respect to sputtering or sample modification can be used.

According to further embodiments, hydrogen may be used with regard to the even further mode of operation in the event materials like a photo resist are etched. The reducing property of hydrogen may be used for an etching of oxygen-containing materials. Nevertheless, hydrogen may be used in an imaging mode for a plurality of materials, like silicon, metals, and the like.

According to an even further embodiment, a fourth gas inlet could be provided. Thereby, a fourth mode of operation can be conducted by introducing a conditioning gas, e.g., oxygen in the enclosure around the emitter tip. According to this embodiment, oxygen can be used for conditioning the tip. This further conditioning mode of operation, wherein the tip of the emitter is shaped or re-shaped, may be supported by the introduction of oxygen. According to yet further embodiments, a fourth or fifth gas may also be used for imaging and/or sample modification modes of operation.

Generally, within the embodiments described herein, at least two different ion beam generating gases can be introduced in the enclosure. According to embodiments described herein, the at least two different ion beam generating gases are introduced as a gas mixture in the enclosure and the ion beam, which is generated to be guided through the column of the focused ion beam device can be selected by changing the voltage between the emitter tip 13 and an extraction electrode or another electrode provided to adjust the electric field at the tip portion of the emitter tip.

As explained above, a light gas and a heavy gas can be used. According to further embodiments, at least one further ion generating gas can be introduced in the enclosure. Thereby, an ion generation gas for etching or an ion generation gas for a second sputtering option (e.g., first sputtering option with argon and second sputtering option with neon or xenon) can be introduced. According to some embodiments, at least a third gas inlet or a mixture of three gases is provided. In the event more than one ion beam generating gas for sputtering or more than one ion beam generating gas for etching is used, also a fourth, fifth, etc gas inlet or a mixture of four, five etc gases can be provided.

Yet according to further embodiments, processing gases in the form of the above mentioned emitter tip conditioning gas (oxygen), carrier gases, purge gases, or the like may be introduced. Processing gases are to be understood as gases, which are not used for ion beam generating, but for process support instead.

According to another embodiment, which is described with respect to FIG. 6, additionally a gas outlet 620 can be provided. The gas outlet 620 may be connected to a vacuum system including a vacuum pump and/or a vacuum recipient. An evacuation of the enclosure 14 can be used to control the pressure in the enclosure and, thereby, control a process parameter for the ion generation. Typically, a partial pressure of the gas to be ionized is controlled to be in the range of 10-6 to 10-2 mbar in the area of the emitter. According to another embodiment, the evacuation of the enclosure 14 can be used during a switching between a first operational mode and a further (second or third) operational mode. Thus, a gas used for the first operational mode can be removed faster from the area of ion generation. As a consequence, a switching between one mode of operation and another mode of operation can be conducted faster, for example, in 5 s or less.

For some embodiments, which can be combined with other implementations, a gas pressure gradient with the gun chamber can be provided. Thereby, the gas pressure is higher in the vicinity of the emitter and the emitter tip and is reduced towards an extraction electrode. Thereby, a sufficient amount of gas can be provided to the emitter tip and the amount of gas that may disturb the ion emission is reduced. According to different examples, which can be combined with any of the embodiments described herein, the gas pressure gradient may reach from 5e-3 mbar to 10e-6 mbar, typically from 10e-3 mbar to 10e-4 mbar.

Figure 7A:
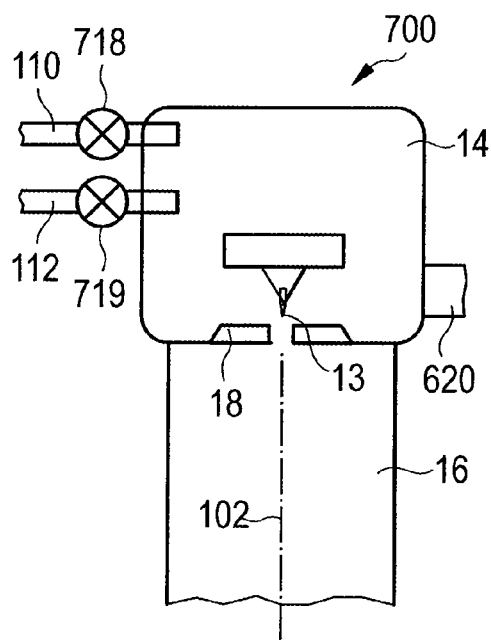
FIG. 7a shows a schematic view of parts of a charged particle beam device in the form of a focused ion beam device with gas inlets and valves according to embodiments described herein.

Within FIG. 7a, a charged particle beam device 700 is shown. The charged particle beam device includes an emitter 12, an enclosure/gun chamber 14, and an ion beam column 16. Ions of gases, which are present in the enclosure 14, are generated by the high electric field of the biased emitter 12.

According to one embodiment, a first gas inlet 110 and a second gas inlet 112 are provided. Additionally, valve 718 is provided within the first gas inlet 110. Further, valve 719 is provided within the second gas inlet 112. The valves are controlled by a controller adapted for switching between introducing the first gas in the enclosure 14 and introducing the second gas in the enclosure.

According to one embodiment, valves 718 and 719 are positioned close to the outlet opening of the gas inlets. Thereby, the amount of gas remaining from a previous operational mode, which has to be removed for a second or third operational mode, is reduced. When one of the valves is closed, the volume, in which the gas of the previous operational mode is still present, is minimized if the valve is positioned close to the outlet opening of the gas inlet. The dead volume of the gas inlet may for example be in the range of 1 $cm^3$ or less. Typically, micro-valves may be used to realize a small dead volume. Herein, a dead volume may be defined as a part of a passage, where a portion could retain materials or gases to contaminate subsequent flow media. During switching the previous gas may contaminate the subsequent gas.

According to other embodiments referred to with respect to FIG. 7a, a gas outlet 620 can also be provided. The gas outlet 620 may be connected to a vacuum system including a vacuum pump or a vacuum recipient. As described above, an evacuation of the enclosure 14 can be used to control the pressure in the enclosure. The evacuation of the enclosure 14 can also be used to evacuate the enclosure during a switching between a first operational mode and a further (second or third) operational mode. Thus, a gas used for the first operational mode can be removed faster from the area of ion generation.

Figure 7B:
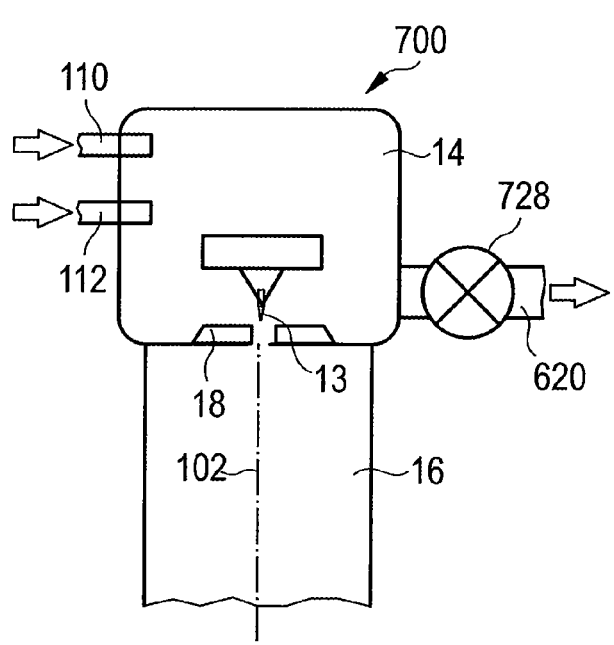
FIG. 7b shows a schematic view of parts of a charged particle beam device in the form of a focused ion beam device with gas inlets and valves according to embodiments described herein.

Within FIG. 7b, the charged particle beam device includes an emitter 12, an enclosure/gun chamber 14, and an ion beam column 16. Ions of gases, which are present in the enclosure 14, are generated by the high electric field of the biased emitter 12. The gases can be introduced in the enclosure according to any of the embodiments described herein.

According to another embodiment, as, for example, described with respect to FIG. 7b, a valve 728 is provided within the gas outlet 620. The valve 428 within the gas outlet may be closed in order to provide a low pressure on the side of the valve opposing the enclosure 14. Thereby, it is possible during a switching between the first operational mode and a further operational mode to open the valve and use the low-pressure on the opposing side for a faster removing of the gas in the enclosure, which has to be removed for switching between the operational modes.

Figure 8:
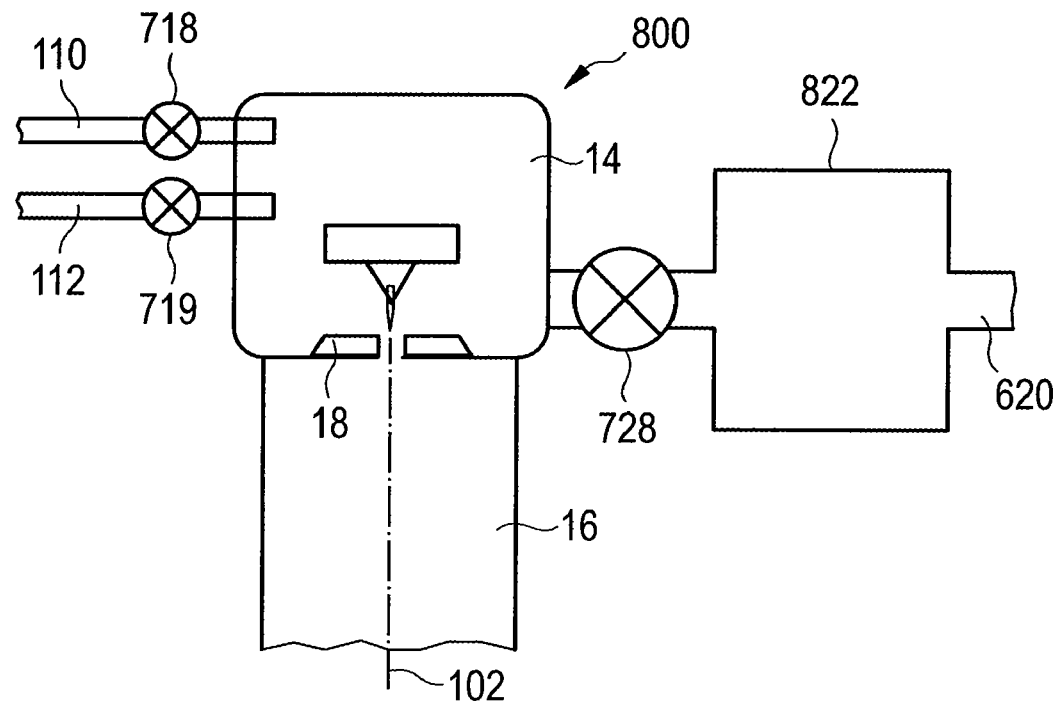
FIG. 8 shows a schematic view of parts of a charged particle beam device in the form of a focused ion beam device with gas inlets, valves and a vacuum recipient according to embodiments described herein.

This aspect may, according to an even further embodiment, the combined with a vacuum recipient 822 as shown in the focused ion beam device 800 of FIG. 8. Within FIG. 8, a charged particle beam device 800 is shown. The charged particle beam device includes an emitter 12, an enclosure/gun chamber 14, and an ion beam column 16. Ions of gases, which are present in the enclosure 14, are generated by the high electric field of the biased emitter 12. Additionally, valve 718 is provided within the first gas inlet 110. Further, valve 719 is provided within the second gas inlet 112. The valves are controlled by a controller adapted for switching between introducing the first gas in the enclosure 14 and the second gas in the enclosure. When one of the valves is closed the volume, in which the gas of the previous operational mode is still present and which needs to be removed for switching to another operational mode, is minimized if the valve is positioned close to the outlet opening of the gas inlet.

Within FIG. 8, the conduit of the gas outlet 620 is connected to a vacuum pump. The vacuum pump evacuates the vacuum recipient 822. Thus, an enlarged volume with low pressure is provided. During opening of valve 728, the volume of the enclosure 14 can be evacuated faster as a consequence of the additional volume of recipient 822. The shorter time for evacuation of the enclosure allows for a faster switching between the two operational modes.

Figure 9:
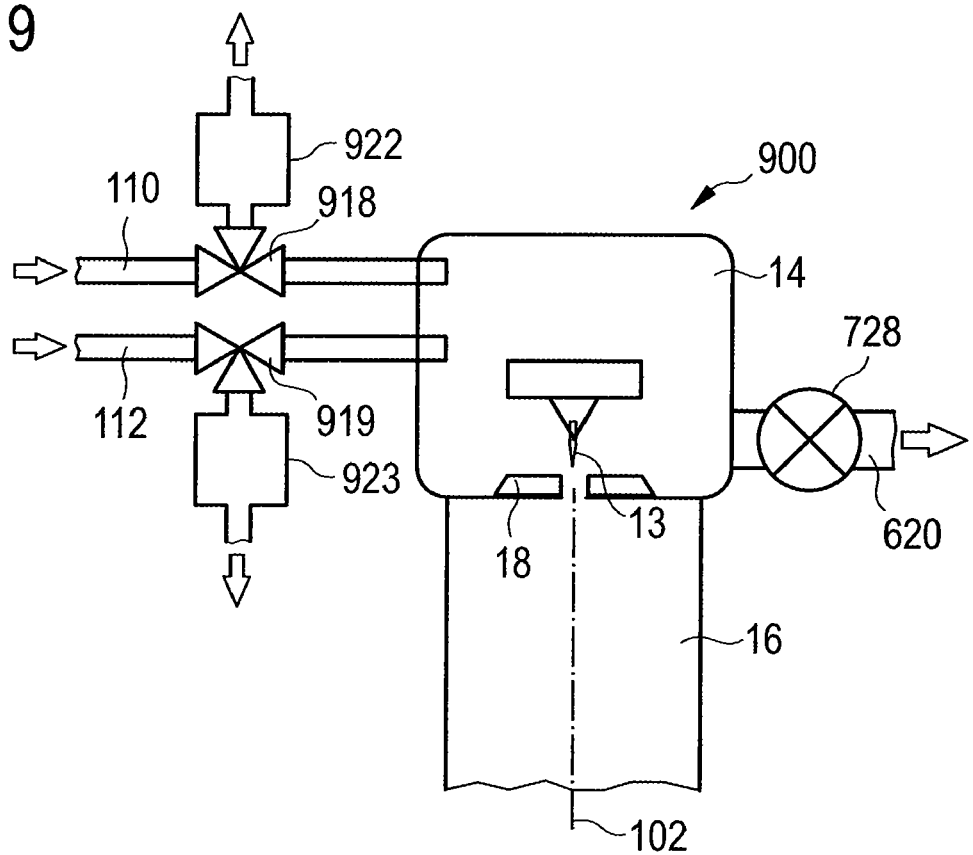
FIG. 9 shows a schematic view of parts of a charged particle beam device in the form of a focused ion beam device with gas inlets, valves and vacuum recipients according to embodiments described herein.

FIG. 9 shows the focused ion beam device 900. The charged particle beam device 900 includes an emitter 12, an enclosure/gun chamber 14, and an ion beam column 16. Ions of gases, which are present in the enclosure 14, are generated by the high electric field of the biased emitter 12.

According to one embodiment, a first gas inlet 110 with a conduit and a second gas inlet 112 with a conduit are provided. Additionally, valve 818 is provided within the first gas inlet 110. Further, valve 819 is provided within the second gas inlet 112. The valves are controlled by a controller adapted for switching between introducing the first gas in the enclosure 14 and the second gas in the enclosure. According to one embodiment, valves 818 and 819 are positioned close to the outlet opening of the gas inlets. Thereby, the amount of gas remaining from a previous operational mode, which has to be removed for a second or third operational mode, is reduced.

Within FIG. 9, valves 818 and 819 are 2-way valves. The further connections of the valves are connected to vacuum recipients 822 and 823, respectively. The vacuum recipients 822 and 823 are evacuated by a vacuum pump or the like. Thereby, an improved switching behavior between a first mode of operation and a further mode of operation may be provided. When for example valve 818 is closed, on the one hand, the supply of the first gas, which has been introduced by the first gas inlet 110, is stopped. On the other hand, the vacuum recipient 822 is connected to the outlet opening portion of the gas inlet. Thereby, the gas remaining in the outlet opening portion of the gas inlet is removed therefrom and the enclosure 14 is evacuated. Currently or thereafter, the valve 819 within the second gas inlet 112 is opened, such that the gas introduced through the second gas inlet can be supplied in the enclosure 14.

According to another embodiment, valves 818 and 819 may be connected with respective conduits to a common vacuum recipient.

According to one embodiment, as shown in FIG. 9, a further gas outlet 620 including valve 728 is provided. The valve 728 within the gas outlet may be closed in order to provide a low pressure on the side of the valve opposing the enclosure 14. Thereby, it is possible during a switching between the first operational mode and a further operational mode to open the valve and use the low-pressure for a faster removing of the gas in the enclosure, which has to be removed for switching between the operational modes.

According to another embodiment, the gas outlet 620 may be omitted. The enclosure 14 may then be evacuated through one of the valves 818 and 819, respectively. Thereby, when one of the valves is in a position to introduce a gas in the area of the emitter 12, the other valve is in a position to evacuate the enclosure 14 via the vacuum recipient connected to the corresponding valve. Generally, by using a 2-way valve, in order to shut off the gas flow, the connection between the gas and the emitter chamber, that is the enclosure, is closed and the connection between the emitter chamber and the vacuum recipient or vacuum pump is opened. This results in an immediate drop of the gas pressure in the emitter.

In addition to the modes of operation, which have been described above, the heavy gas ion beam can be used for material analysis. Thereby, a detector suitable for secondary ion mass spectrometry SIMS 722 (See, e.g., FIG. 1) is provided. The detector detects and analyzes the ions of specimen, which are created by sputtering. On sputtering, the specimen emits particles, some of which are themselves ions. These secondary ions are measured with a mass spectrometer to determine the quantitative elemental or isotopic composition of the surface.

According to one embodiment, the sputtering is realized by the ion beam emitted by emitter 12 as shown in the previous figures. According to another embodiment, an additional flood electron source 732 (see, e.g., FIG. 1) may be provided. Thereby the number of ionized secondary particles, which are released from the specimen on impingement of the ion beam from emitter 12, can be increased. The increased amount of ionized secondary particles improves the detection sensitivity of detector.

As described above, a single column charged particle beam device in the form of a focused ion beam device can be provided which allows for a high resolution imaging and sample modification. Thereby, in light of the fact that only one column is used, a reduction of costs can be achieved.

While the foregoing is directed to embodiments of the invention, other and further embodiments of the invention may be devised without departing from the basic scope thereof, and the scope thereof is determined by the claims that follow.

The invention claimed is:

1. A focused ion beam device, comprising:
   an ion beam column including an enclosure for housing a gas field ion source emitter with an emitter area for generating ions;
   an electrode for extracting ions from the gas field ion source emitter;
   one or more gas inlets adapted to introduce a first gas and a second gas to the emitter area, so that a gas mixture including said first gas and said second gas can be formed in said emitter area;
   an objective lens for focusing the ion beam generated from the first gas or the second gas;
   a voltage supply for providing a voltage between the electrode and the gas field ion source emitter; and
   a controller configured for switching between a first voltage and a second voltage of the voltage supply for generating an ion beam of ions of the first gas or an ion beam of ions of the second gas so that, during use, said gas field ion source emitter is operable with different operation modes.

2. A focused ion beam device, comprising:
   an ion beam column including an enclosure for housing an emitter with an emitter area for generating ions of a light gas and a heavy gas an electrode for extracting ions from the gas field source emitter;
   one or more gas inlets adapted to introduce a light gas and a heavy gas to the emitter area, so that a gas mixture including said light gas and said heavy gas can be formed in said emitter area; and means for switching between a first extraction voltage and a second extraction voltage so that during use said gas field ion source emitter is operable with different operation modes, wherein the light gas is selected from the group consisting of hydrogen and helium and the heavy gas has an atomic mass of 10 g/mol or higher.

3. The device according to claim 2, wherein the heavy gas is selected from the group consisting of argon, neon, krypton, and combinations thereof.

4. The device according to claim 1, further comprising:
a first valve provided within the first gas inlet and a second valve provided within the second gas inlet, wherein the first valve and the second valve are controlled for adapting the partial pressures of the first gas and the second gas, and
wherein the first valve has a first gas supply conduit to a gas supply for the first gas, a first gas inlet conduit for introducing the first gas in the chamber and a first evacuation conduit for connection to at least one vacuum recipient, and wherein the second valve has a second gas supply conduit to a gas supply for the second gas, a second gas inlet conduit for introducing the second gas in the chamber and a second evacuation conduit for connection to the at least one vacuum recipient.

5. The device according to claim 1, further comprising a gas outlet connected to a vacuum system adapted to evacuate the enclosure and wherein the vacuum system includes a vacuum recipient.

6. The device according to claim 1, further comprising:
a scan deflector provided in the ion beam column and adapted for scanning an ion beam over a specimen;
a detector provided in the ion beam column and adapted for time resolved detection of corpuscles released from the specimen on impingement of the ion beam; and
a controller connected to the scan deflector and the detector.

7. The device according to claim 6, wherein the time resolved measurement is adapted for a time resolution of 2 µs or below 2 µs.

8. The device according to claim 1, wherein the enclosure is provided in a gun chamber of the ion beam column.

9. The device according to claim 1, wherein the enclosure has a volume of 5 cm$^3$ or less.

10. The device according to claim 1, further comprising:
a mass spectrometer for identification of ions or ionized particles released from the specimen.

11. The device according to claim 10, further comprising:
a flood electron gun provided in an area adjacent to a specimen area.

12. The device according to claim 1, wherein the first gas is a light gas selected from the group consisting of hydrogen and helium, wherein the second gas is a heavy gas selected from the group consisting of argon, neon, krypton, and combinations thereof.

13. The device according to claim 1, further comprising:
a mass separator for separating ions from the first gas from ions from the second gas.

14. A method of operating a focused ion beam device, comprising:
biasing an emitter within an emitter area wherein ions are generated to a first potential for providing a first extraction voltage for emitting an ion beam of a light gas; and
biasing an emitter within an emitter area wherein ions are generated to a second potential for providing a second extraction voltage for emitting an ion beam of a heavy gas,
wherein the light gas is selected from the group consisting of hydrogen and helium and the heavy gas has an atomic mass of 10 g/mol or higher.

15. The method according to claim 14, further comprising:
evacuating an enclosure surrounding the emitter area.

16. The method according to claim 14, wherein the switching includes controlling a power supply for an extraction voltage.

17. The method according to claim 14 further comprising:
scanning the ion beam generated from the light ion beam generating gas over a specimen for an observation mode, and detecting corpuscles released from the specimen on impingement of the ion beam from the light ion beam generating gas for observation of the specimen; and
modifying the specimen during a modification mode, during a time the heavy ion beam generating gas is introduced in the emitter area.

18. The method according to claim 14, further comprising:
mass detecting of ionized particles released from the specimen during a time the heavy ion beam generating gas is introduced in the emitter area.

19. The method according to claim 18, further comprising:
ionizing particles released from the specimen during a time the heavy ion beam generating gas is introduced in the emitter area.

20. The method according to claim 14, wherein the heavy ion beam generating gas selected from the group consisting of argon, neon, krypton, and combinations thereof.

21. The method according to claim 14, further comprising:
introducing a processing gas in the emitter area.

22. The method according claim 21, wherein the processing gas is oxygen.

23. The method according to claim 14, further comprising:
introducing a further heavy ion beam generating gas into the emitter area, wherein the further ion beam generating heavy gas has an atomic mass of 10 g/mol or higher.

24. The method according to claim 14, further comprising:
introducing a hydrogen into the emitter area for an etching operation mode.

25. The method according to claim 14, further comprising:
separating light ions from heavy ions.

* * * * *

UNITED STATES PATENT AND TRADEMARK OFFICE
CERTIFICATE OF CORRECTION

PATENT NO.         : 7,968,855 B2
APPLICATION NO.    : 12/366390
DATED              : June 28, 2011
INVENTOR(S)        : Frosien It is certified that error appears in the above-identified patent and that said Letters Patent is hereby corrected as shown below:

Column 12, Claim 2, Line 62, please insert --;-- after heavy gas;

Column 12, Claim 2, Line 63, please insert --ion-- after field.

Signed and Sealed this
Twenty-second Day of November, 2011

David J. Kappos
*Director of the United States Patent and Trademark Office*